US006582827B1

(12) United States Patent
Im

(10) Patent No.: US 6,582,827 B1
(45) Date of Patent: Jun. 24, 2003

(54) SPECIALIZED SUBSTRATES FOR USE IN SEQUENTIAL LATERAL SOLIDIFICATION PROCESSING

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 118 days.

(21) Appl. No.: 09/722,778

(22) Filed: Nov. 27, 2000

(51) Int. Cl.$^7$ ................................................ B32B 9/00
(52) U.S. Cl. ........................ 428/446; 428/426; 428/432; 428/433; 428/325; 428/328; 428/450; 428/312.6; 428/641; 428/428
(58) Field of Search ................................. 428/446, 426, 428/432, 433, 325, 328, 450, 312.6, 641, 428

(56) References Cited

U.S. PATENT DOCUMENTS 5,233,207 A * 8/1993 Anzai ........................... 257/66
6,190,985 B1 * 2/2001 Buynoski ..................... 438/311
6,320,227 B1 * 11/2001 Lee et al. .................... 257/347
6,333,232 B1 * 12/2001 Kunikiyo ..................... 438/296

OTHER PUBLICATIONS

J.S. Im et al., "Controlled Super–Lateral Growth of Si Films for Microstructural Manipulation and Optimization" phys. stat. sol. (a) 166, p. 605–617, (1998) No month.
Endert et al., Excimer laser: a new tool for precision micromaching. Optical and Quantum Electronics, *vol. 27*, p. 1319–1335, (1995). No month.
Brotherton, et al., "Influence of melt depth in laser crystallized poly–Si thin film transistors", J. Appl. Phys. *vol. 82*, No. 8, p. 4086–4095, Oct. 15, 1997.
Im et al., "Crystalline Si Films for Integrated Active–Matrix Liquid–Crystal Displays", MRS Bulletin, p. 39–48, 1996. No month.
Brochure from MicroLas Lasersystem, GmbH, "UV Optics Systems for Excimer Laser Based Micromaching and Marking". No date.
Ishida et al., "Ultra–shallow boxlike profiles fabricated by pulsed ultraviolet–laser doping process", J. Vac. Sci. Technol. B 12(1), p. 399–403, 1994. (No month).
Yoshimoto, et al., "Excimer–Laser–Produced and Two–Dimensionally Position–Controlled Giant Si Grains on Organic SOG Underlayer", p. 285–286, AM–LCD 2000. No month.
Ozawa et al., "Two–Dimensionally Position–Controlled Exicer–Laser–Crystallization of Silicon Thin Films on Glassy Substrate", Jpn. J. Appl. Phys. *vol. 38*, Part 1, No. 10, p. 5700–5705, (1999). No month.

* cited by examiner

*Primary Examiner*—Deborah Jones
*Assistant Examiner*—Ling Xu
(74) *Attorney, Agent, or Firm*—Baker Botts LLP

(57) ABSTRACT

Substrates having modified effective thermal conductivity for use in the sequential lateral solidification process are disclosed. In one arrangement, a substrate includes a glass base layer, a low conductivity layer formed adjacent to a surface of the base layer, a high conductivity layer formed adjacent to the low conductivity layer, a silicon compound layer formed adjacent to the high conductivity layer, and a silicon layer formed on the silicon compound layer. In an alternative arrangement, the substrate includes an internal subsurface melting layer which will act as a heat reservoir during subsequent sequential lateral solidification processing.

17 Claims, 2 Drawing Sheets

SPECIALIZED SUBSTRATES FOR USE IN SEQUENTIAL LATERAL SOLIDIFICATION PROCESSING

NOTICE OF GOVERNMENT RIGHTS

The U.S. Government has certain rights in this invention pursuant to the terms of the Defense Advanced Research Project Agency award number N66001-98-1-8913.

BACKGROUND OF THE INVENTION

I. Field of the Invention.

The present invention relates to techniques for processing of semiconductor films, and more particularly to techniques for processing semiconductor films on glass or other substrates.

II. Description of the Related Art.

Techniques for fabricating large grained single crystal or polycrystalline silicon thin films using sequential lateral solidification are known in the art. For example, in U.S. patent application Ser. No. 09/390,537, the contents of which are incorporated by reference herein and which application is assigned to the common assignee of the present application, particularly advantageous apparatus and methods for growing large grained polycrystalline or single crystal silicon structures using energy-controllable laser pulses and small-scale translation of a silicon sample to implement sequential lateral solidification are disclosed. Using the sequential lateral solidification technique, low defect density crystalline silicon films can be produced on those substrates that do not permit epitaxial regrowth, upon which high performance microelectronic devices can be fabricated.

The effectiveness with which sequential lateral solidification can be implemented depends on several factors, the most important of which corresponds to the length of lateral crystal growth achieved per laser pulse. Such lateral crystal growth depends on several parameters, including the duration of the laser pulses, film thickness, substrate temperature at the point of laser pulse irradiation, the energy density of the laser pulse incident on the substrate, and the effective thermal conductivity of the substrate. In particular, if all other factors are kept constant, reducing is the thermal conductivity of the substrate will have the effect of increasing lateral crystal growth.

While there have been attempts to utilize low thermal conductivity materials, such as porous glass, in connection with sequential lateral solidification for the purpose of enhancing lateral crystal growth, such attempts have not achieved commercially viable results. For example, when a porous glass layer is used under a silicon film in the sequential lateral solidification process densification, and subsequent physical distortion, of such glass has been observed. Accordingly, there exists a need in the art for a technique for fabricating substrates having a modified effective thermal conductivity in order to optimize the sequential lateral solidification process.

SUMMARY OF THE INVENTION

An object of the present invention is to provide substrates having modified effective thermal conductivity which can be later used in an optimized sequential lateral solidification process.

A further object of the present invention is to provide substrates having modified effective thermal conductivity.

Still a further object of the present invention is to provide substrates having a directionally optimized effective thermal conductivity.

Yet a further object of the present invention is to provide multi layer substrates where one or more of the subsurface layers act as a heat reservoir in order to optimize the effective thermal characteristics of the substrate.

In order to achieve these objectives as well as others that will become apparent with reference to the following specification, the present invention provides a substrate having modified effective thermal conductivity for use in the sequential lateral solidification process. The substrate includes a base layer, e.g., glass, a low conductivity layer formed adjacent to a surface of the base layer, a high conductivity layer formed adjacent to the low conductivity layer, and a silicon layer formed on the high conductivity layer.

In a preferred arrangement, the low conductivity layer is porous glass, and is in the range of 5,000 Angstroms to 2 microns thick. The high conductivity layer may be a metal, and should be sufficiently thin so as to not increase the overall vertical conductivity of the substrate, preferably in the range of 50 to 5,000 Angstroms thick.

An intermediate silicon compound layer is preferably formed between the silicon layer and the high conductivity layer. The silicon compound may be silicon dioxide, and should be sufficiently thick to prevent diffusion of impurities from the high conductivity layer. It is preferred that the silicon compound layer is in the range of 200 to 2,000 Angstroms thick.

In an alternative arrangement, the present invention provides a substrate having modified effective thermal conductivity for use in the sequential lateral solidification process, wherein the high conductivity layer is replaced by an internal subsurface melting layer. In this arrangement, the substrate includes a base layer, a low conductivity layer formed adjacent to the base layer, a subsurface melting layer having a melting point which is less than that of silicon and formed adjacent to the low conductivity layer, a silicon compound layer formed adjacent to the subsurface melting layer, and silicon layer formed on the silicon compound layer.

The accompanying drawings, which are incorporated and constitute part of this disclosure, illustrate a preferred embodiment of the invention and serve to explain the principles of the invention.

DESCRIPTION OF PREFERRED EMBODIMENTS

Figure 1:
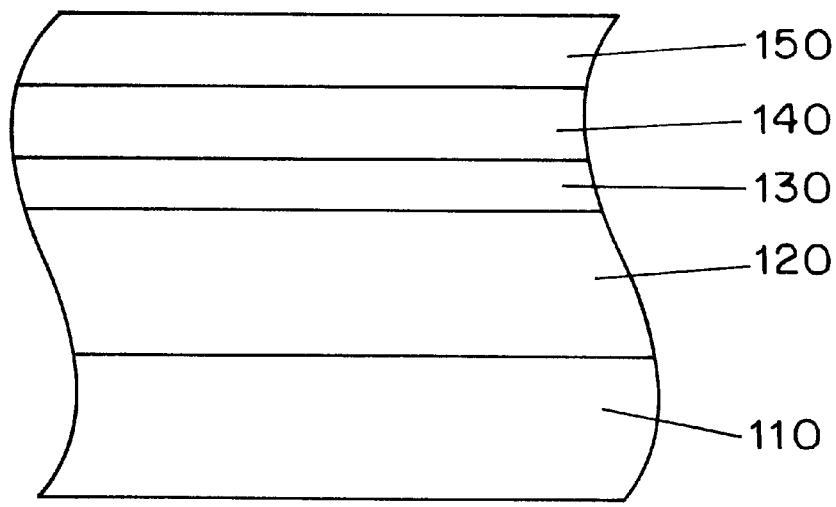
FIG. 1 is a schematic diagram of a substrate in accordance with a preferred embodiment of the present invention.

Referring to FIG. 1, a preferred embodiment of the present invention will be described. As shown in FIG. 1, the substrate 100 includes a bulk glass plate layer 110, a low conductivity layer 120, a high conductivity layer 130, a silicon dioxide layer 140, and a semiconducting film layer 150. The multilayer structure of substrate 100 may be fabricated by any combination of thin film formation techniques, such as physical or chemical vapor deposition,, electrochemical deposition, or spin coating.

The low conductivity layer 120 may be porous glass or a polymer film layer. In addition, the layer 120 must have a conductivity which is less than the glass plate 110 and sufficiently thick so that the glass plate layer 110 will not participate when the substrate 100 is used in later processing. Layer 120 will be in the order of 5,000 Angstroms to 2 microns thick.

The high conductivity layer 130 may be a metallic layer such as copper or aluminum. The high conductivity layer must have a conductivity which is greater than that of the glass plate 110, and sufficiently thin so as to not increase the overall vertical conductivity of the substrate 100, i.e., conductivity in the direction which crosses layers 110, 120, 130, 140, 150. Typically, layer 130 will be in the order of 50 to 5,000 Angstroms thick.

The silicon dioxide layer 140 should be sufficiently thick to prevent potential diffusion of unwanted impurities from the underlying layer 130 to the silicon cap 150. The Layer 140 will be in the order of 200 to 2,000 Angstroms thick. Alternatively, the layer 140 may be fabricated from silicon nitride or a mixture of silicon dioxide and silicon nitride.

Alternatively, the high conductivity layer 130 may be formed from a material which is electrically and chemically compatible with the semiconducting film layer 150, such as diamond, In this case, the silicon dioxide layer 140 may be omitted, with the semiconducting film layer. 150 formed directly on the high conductivity layer 130.

Finally, the top semiconducting film layer may be either be amorphous, microcrystalline or polycrystalline silicon, or a mixture thereof. Typically, layer 150 will be in the order of 200 to 2,000 Angstroms thick.

When fabricated as described above, the substrate 100 will exhibit either a reduced overall effective thermal conductivity, or a reduced effective thermal conductivity in the vertical direction. Having such a modified thermal conductivity, the substrate 100 is highly useful in order to improve lateral crystal growth in the lateral solidification process, as will be now described.

Figure 2:
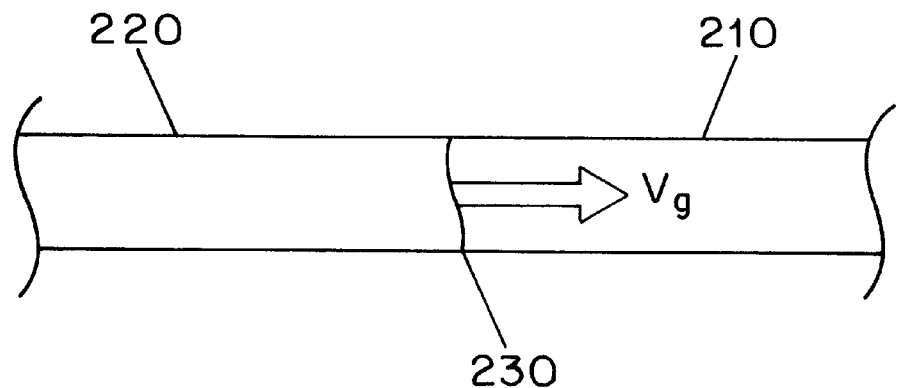
FIG. 2 is an illustrative diagram showing lateral solidification of silicon.

Referring next to FIG. 2, the lateral solidification of silicon in accordance with the above-noted sequential lateral solidification technique is illustrated. FIG. 2 represents a cross sectional view of the silicon film 150 as it may appear during lateral solidification, with liquid silicon 210 solidifying into crystalline silicon 220 at a velocity Vg. As the liquid silicon solidifies through the motion of the interface 230, latent heat is released at the interface 230 due to reduction in enthalpy associated with the liquid to solid transition. The lateral solidification will continue along moving boundary 230 until either impingement of the interface with another similar interface, or until nucleation.

Figure 3A:
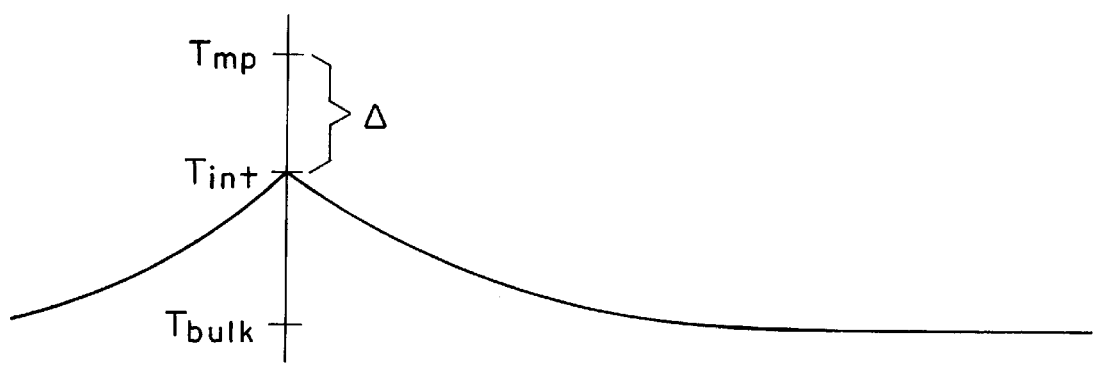
FIGS. 3*a* and *b* are graphs showing the relationship between the temperature of solidifying silicon and the position of such silicon around a liquid to solid interface.

Referring next to FIG. 3a, a graphs showing the relationship between the temperature of solidifying silicon and the position of such silicon around a liquid to solid interface is shown, where $T_{bulk}$ represents the temperature of the bulk liquid silicon as it cools, $T_{int}$ represents the temperature of the silicon as the interface 230, and $T_{mp}$ represents the melting temperature of silicon. As those skilled in the art will appreciate, the temperature of $T_{int}$ will impact the growth rate of the forming crystal, with a lower temperature leading to a faster growth rate. Likewise, when $T_{bulk}$ reaches a certain temperature range, random nucleation will commence, ceasing the crystal growth process.

Figure 3B:
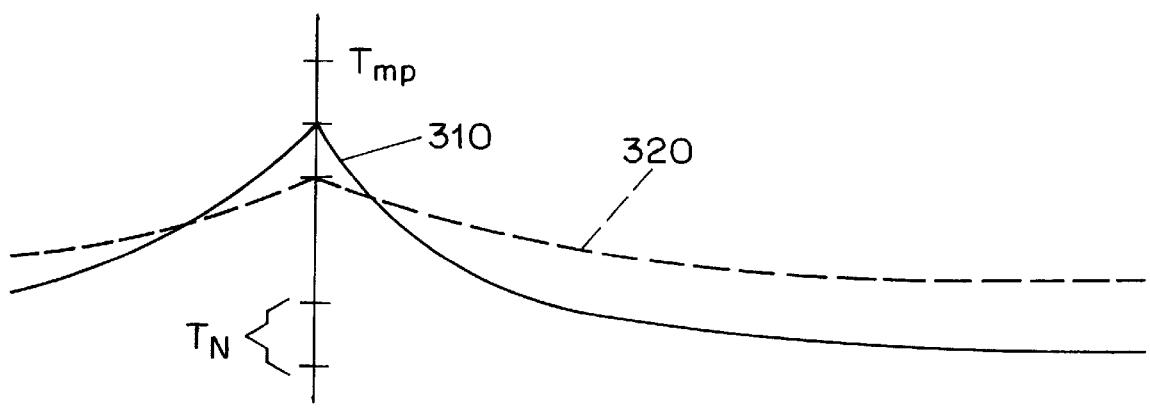
Figure 4:
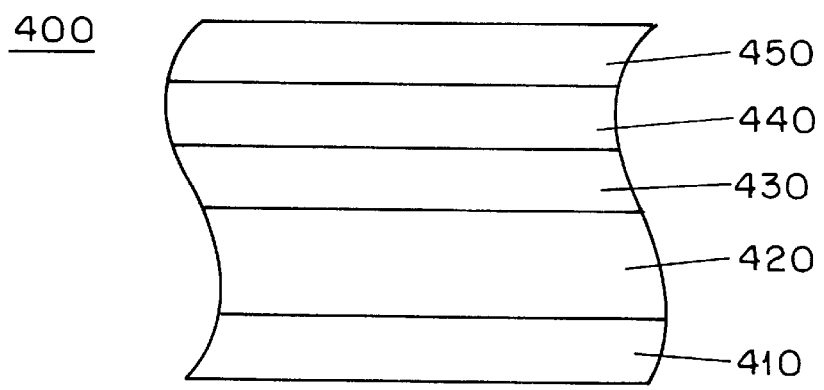
FIG. 4 is a schematic diagram of a substrate in accordance with a second preferred embodiment of the present invention.

Referring to FIG. 3b, two possible temperature profiles for solidifying silicon are shown, at a time t after laser irradiation. The temperature profile 310 represents a poor temperature profile, as the high interface temperature will cause slow lateral solidification, and the low temperature in the region away from the interface 230 will cause the temperature of those regions of liquid silicon to drop below the nucleation temperature range, $\Delta T_N$. In contrast the temperature profile 320 represents a optimal temperature profile, with a lower interface temperature causing more rapid lateral solidification, and a less cooling in the liquid silicon away from the interface 230 such that the temperature remains above the nucleation temperature range for a loner time., Referring next to FIG. 4, a substrate in accordance with a second preferred embodiment of the present invention is now described. As shown in FIG. 4, the substrate 400 includes a bulk glass plate layer 410, a low conductivity layer 420, a subsurface melting layer 430, a silicon dioxide layer 440 and a semiconductor layer 450 made from a predetermined semiconductor material. The low conductivity layer 420, a silicon dioxide layer 440 and semiconductor layer 450 may be fabricated as described above in connection with substrate 100 by any combination of thin film formation techniques, such as physical or chemical vapor deposition, electrochemical deposition, or spin coating.

The subsurface melting layer 430 must have a melting point which is less than or equal to that of the predetermined semiconductor material, and preferably should exhibit an increased conductivity after melting. In addition, it is highly preferable to use a material having a high latent heat for the melting layer 430, such as Silicon Germanium alloy. A 1000 Angstrom thick layer of Silicon Germanium alloy would be suitable for melting layer 430 Alternatively, an approximately 1000 Angstrom thick layer of certain metals such as Aluminum or Copper could be used for melting layer 430.

When fabricated as described above, the substrate 400 will exhibit either a reduced overall effective thermal conductivity, or a reduced effective thermal conductivity in the vertical direction. When used in the sequential lateral solidification process, the melting layer 430 will partially or completely melt, thereby storing heat. Later, as the melting layer solidifies, heat will be released through the phase transformation from liquid to solid, thereby preventing rapid cooling of the overlying silicon layer 450, and delaying nucleation. Thus, as shown in FIG. 3b, the solidification of the melting layer 430 will have the effect of moving the temperature profile of the solidifying silicon layer up from profile 310 to profile 320 in the regions away from the boundary 230. With such a modified thermal conductivity, the substrate 400 is likewise highly useful in order to improve lateral crystal growth in the lateral solidification process.

The foregoing merely illustrates the principles of the invention. Various modifications and alterations to the described embodiments will be apparent to those skilled in the art in view of the teachings herein. For example, the silicon layer 150, 450 may be replaced by other semiconductors such Germanium, Silicon Germanium, Gallium Arsenide, or Gallium Nitride, with, in the case of the second embodiment, suitable modifications to the melting layer 430. Likewise, other metals may be used for the high conductivity layer 130. Moreover, the high and low conductivity layers may be either a single unitary layer, or consist of multiple sub-layers. It will thus be appreciated that those skilled in the art will be able to devise numerous systems and methods which, although not explicitly shown or described herein, embody the principles of the invention and are thus within the spirit and scope of the invention.

I claim:

1. A substrate having modified effective thermal conductivity for use in the sequential lateral solidification process, comprising:
   (a) a base layer having a base layer conductivity and at least a top surface, said base layer comprising glass;
   (b) a low conductivity layer having a conductivity which is less than said base layer conductivity, a first side and a second side, said low conductivity layer first side formed adjacent to said top surface of said base layer;
   (c) a high conductivity layer having a conductivity which is greater than said base layer conductivity, a first side and a second side, said high conductivity layer first side formed adjacent to said second side of said low conductivity layer; and
   (d) a semiconductor layer formed on said second side of said high conductivity layer.

2. The substrate of claim 1, wherein said low conductivity layer comprises porous glass.

3. The substrate of claim 2, wherein said low conductivity layer is in the range of 5,000 Angstroms to 2 microns thick.

4. The substrate of claim 1, wherein said high conductivity layer comprises a metal.

5. The substrate of claim 4, wherein said high conductivity layer is in the range of 50 to 5,000 Angstroms thick.

6. The substrate of claim 1, further comprising a silicon compound layer having a first side and a second side, wherein said silicon compound layer first side is formed adjacent to said second side of said high conductivity layer and said semiconductor layer is formed on said second side of said silicon compound layer.

7. The substrate of claim 6, wherein said silicon compound comprises silicon dioxide, and said silicon compound layer is sufficiently thick to prevent diffusion of impurities from said high conductivity layer.

8. The substrate of claim 7, wherein said silicon compound layer is in the range of 200 to 2,000 Angstroms thick.

9. A substrate having modified effective thermal conductivity for use in the sequential lateral solidification process, comprising:
   (a) a base layer having a base layer conductivity and at least a top surface, said base layer comprising glass;
   (b) a low conductivity layer having a conductivity which is less than said base layer conductivity, a first side and a second side, said low conductivity layer first side formed adjacent to said top surface of said base layer;
   (c) a subsurface melting layer having a first side and a second side, said subsurface melting layer first side formed adjacent to said second side of said low conductivity layer;
   (d) a silicon compound layer having a first side and a second side, said silicon compound layer first side formed adjacent to said second side of said subsurface melting layer; and
   (e) a semiconductor layer formed on said second side of said silicon compound layer, wherein said subsurface melting layer is adapted to melt at a temperature which is less than or equal to a melting temperature of said semiconductor layer.

10. The substrate of claim 9, wherein said low conductivity layer comprises porous glass.

11. The substrate of claim 10, wherein said low conductivity layer is in the range of 5,000 Angstroms to 2 microns thick.

12. The substrate of claim 9, wherein said melting layer exhibits an increased conductivity after melting.

13. The substrate of claim 9, wherein said melting layer comprises a material having a high latent heat.

14. The substrate of claim 13, wherein said melting layer comprises Silicon Germanium.

15. The substrate of claim 14, wherein said melting layer is approximately 1000 Angstroms thick.

16. The substrate of claim 9, wherein said silicon compound comprises silicon dioxide, and said silicon compound layer is sufficiently thick to prevent diffusion of impurities from said melting layer.

17. The substrate of claim 16, wherein said silicon compound layer is in the range of 200 to 2,000 Angstroms thick.

* * * * *